United States Patent
Chuang

(10) Patent No.: US 11,356,088 B2
(45) Date of Patent: Jun. 7, 2022

(54) OVER-CURRENT PROTECTION CIRCUIT FOR POWER CIRCUIT

(71) Applicant: Delta Electronics, Inc., Taoyuan (TW)

(72) Inventor: Po-Chin Chuang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/155,957

(22) Filed: Jan. 22, 2021

(65) Prior Publication Data
US 2021/0226443 A1  Jul. 22, 2021

Related U.S. Application Data

(60) Provisional application No. 62/964,381, filed on Jan. 22, 2020.

(51) Int. Cl.
| | |
|---|---|
| *H03K 17/16* | (2006.01) |
| *H02H 9/02* | (2006.01) |
| *H03K 3/012* | (2006.01) |
| *H02H 1/00* | (2006.01) |
| *H02M 1/08* | (2006.01) |
| *H02M 1/32* | (2007.01) |
| *H03K 17/687* | (2006.01) |

(52) U.S. Cl.
CPC ......... *H03K 17/165* (2013.01); *H02H 1/0007* (2013.01); *H02H 9/02* (2013.01); *H02M 1/08* (2013.01); *H02M 1/32* (2013.01); *H03K 3/012* (2013.01); *H03K 17/687* (2013.01); *H03K 2217/0036* (2013.01)

(58) Field of Classification Search
CPC ..................... H02H 9/02; H02H 9/025; H03K 17/082–0828; H03K 17/165
See application file for complete search history.

(56) References Cited

U.S. PATENT DOCUMENTS 5,091,664 A * 2/1992 Furuhata ............ H03K 17/0828
                                              327/574
7,038,436 B2    5/2006 Goto
                   (Continued)

FOREIGN PATENT DOCUMENTS

TW           I678605 B       12/2019

OTHER PUBLICATIONS

Office Action and Search Report issued in TW110102407 dated Oct. 7, 2021, 6 pages.

*Primary Examiner* — Jared Fureman
*Assistant Examiner* — Christopher J Clark
(74) *Attorney, Agent, or Firm* — Muncy, Geissler, Olds & Lowe, P.C.

(57) ABSTRACT

An over-current protection circuit for limiting a power current flowing through a switch device, which generates the power current according to a control signal of a control node, is provided. The over current control circuit includes a voltage control circuit, a current sense unit, a conversion circuit, and a control switch. The voltage control circuit provides the control signal to a gate terminal of the switch device according to a limit signal. The current sense unit senses the power current flowing through the switch device to generate a sense voltage. The conversion circuit converts the sense voltage into a conversion voltage. The control switch generates the limit signal according to the conversion voltage.

12 Claims, 5 Drawing Sheets

(56) References Cited

U.S. PATENT DOCUMENTS

| | | | |
|---|---|---|---|
| 9,046,555 B2 | 6/2015 | Bucsa | |
| 9,362,830 B2 | 6/2016 | Li | |
| 2001/0026429 A1* | 10/2001 | Fukuda | H03K 17/0828 |
| | | | 361/93.9 |
| 2014/0321012 A1* | 10/2014 | Nakayama | H02M 1/088 |
| | | | 361/57 |
| 2015/0042302 A1* | 2/2015 | Forghani-zadeh | G05F 1/573 |
| | | | 323/282 |

* cited by examiner

OVER-CURRENT PROTECTION CIRCUIT FOR POWER CIRCUIT

CROSS REFERENCE TO RELATED APPLICATIONS

This application claims the benefit of U.S. Provisional Application No. 62/964,381, filed on Jan. 22, 2020, the entirety of which is incorporated by reference herein.

BACKGROUND OF THE INVENTION

Field of the Invention

The disclosure relates generally to power circuits, and more particularly it relates to power circuits with over-current protection.

Description of the Related Art

Power switch devices, such as field effect transistors (FETs) and GaN transistors that are used in high-power applications, are often subjected to excessive currents that exceed safe operating limits during fault conditions. Being subjected to excessive currents can destroy the power switch devices or shorten the life of the devices, especially those devices that do not have associated over-current protection. As such, there is a need for cost effective, reliable over-current protection and low power consumption for power switch devices.

BRIEF SUMMARY OF THE INVENTION

Over-current protection circuits are provided herein so that the power switch devices can be prevented from burning out. In addition, the over-current protection circuits provided herein may be utilized as short-circuit protection.

In an embodiment, an over-current protection circuit for limiting a power current flowing through a switch device is provided. The switch device generates the power current according to a control signal of a control node. The over current control circuit comprises a voltage control circuit, a current sense unit, a conversion circuit, and a control switch. The voltage control circuit provides the control signal to a gate terminal of the switch device according to a limit signal. The current sense unit senses the power current flowing through the switch device to generate a sense voltage. The conversion circuit converts the sense voltage into a conversion voltage. The control switch generates the limit signal according to the conversion voltage.

According to an embodiment of the invention, when the conversion voltage exceeds the threshold voltage of the control switch, the control switch generates the limit signal so that the voltage control circuit stops providing the control signal to the switch device so as to restrict the power current to within a safety range. When the conversion voltage does not exceed the threshold voltage of the control switch, the control switch does not generate the limit signal so that the voltage control circuit keeps providing the control signal to the switch device.

According to an embodiment of the invention, the current sense unit is connected in series with the switch device.

According to an embodiment of the invention, the power current first flows through the current sense unit and then flows through the switch device.

According to another embodiment of the invention, the power current first flows through the switch device and then flows through the current sense unit.

According to an embodiment of the invention, the current sense circuit comprises a sense resistor. The sense resistor is coupled to the switch device at the sense node and generating the sense voltage at the sense node.

According to an embodiment of the invention, the voltage control circuit comprises a first control resistor and a second control resistor. The first control resistor is coupled between the control node and the gate terminal of the switch device. The second control resistor is coupled between the gate terminal of the switch device and the limit node. The limit node receives the limit signal. The control switch comprises an NPN transistor. The NPN transistor comprises a base terminal, a collect terminal coupled to the limit node, and an emitter terminal coupled to a low voltage level.

According to an embodiment of the invention, the conversion circuit comprises a first conversion resistor and a zener diode. The first conversion resistor is coupled between the sense node and a first conversion node. The zener diode comprises a cathode coupled to the first conversion node and an anode coupled to a second conversion node. The second conversion node is coupled to the base terminal of the NPN transistor. The conversion circuit generates the conversion voltage at the second conversion node.

According to an embodiment of the invention, when the conversion voltage exceeds a threshold voltage of the NPN transistor, the NPN transistor is turned on to pull the limit signal of the limit node down to the low voltage level so that the voltage control circuit stops providing the control signal to the switch device so as to restrict the power current to within a safety range. When the conversion voltage does not exceed the threshold voltage of the NPN transistor, the limit node is floating so that the voltage control circuit provides the control signal to the switch device.

According to another embodiment of the invention, the conversion circuit comprises a second conversion resistor and a third conversion resistor. The second conversion resistor is coupled between the sense node and a conversion node. The third conversion resistor is coupled between the conversion node and the low voltage level. The conversion node is coupled to the base terminal of the NPN transistor. The conversion circuit generates the conversion voltage at the conversion node.

According to an embodiment of the invention, the conversion circuit divides the sense voltage by a ratio of the second conversion resistor and the third conversion resistor to generate the conversion voltage. When the conversion voltage exceeds a threshold voltage of the NPN transistor, the NPN transistor is turned on to pull the limit signal of the limit node down to the low voltage level so that the voltage control circuit stops providing the control signal to the switch device so as to restrict the power current to within a safety range. When the conversion voltage does not exceed the threshold voltage of the NPN transistor, the limit node is floating so that the voltage control circuit provides the control signal to the switch device.

According to an embodiment of the invention, the current sense circuit comprises a sense transistor and a first sense resistor. The sense transistor comprises a gate terminal coupled to a gate terminal of the switch device, a drain terminal coupled to a drain terminal of the switch device, and a source terminal. The first sense resistor is coupled between the source terminal of the sense transistor and a source terminal of the switch device. The conversion circuit converts a voltage at the source terminal of the sense transistor into the conversion voltage.

In an embodiment, a power circuit comprises a switch device and an over-current protection circuit. The switch device generates the power current according to a control signal of a control node. The over-current protection circuit limits the power current flowing through the switch device. The over current control circuit comprises a voltage control circuit, a current sense unit, a conversion circuit, and a control switch. The voltage control circuit provides the control signal to a gate terminal of the switch device according to a limit signal. The current sense unit senses the power current flowing through the switch device to generate a sense voltage. The conversion circuit converts the sense voltage into a conversion voltage. The control switch generates the limit signal according to the conversion voltage.

According to an embodiment of the invention, when the conversion voltage exceeds a threshold voltage of the control switch, the control switch generates the limit signal so that the voltage control circuit stops providing the control signal to the switch device so as to restrict the power current to within a safety range. When the conversion voltage does not exceed the threshold voltage of the control switch, the control switch does not generate the limit signal so that the voltage control circuit keeps providing the control signal to the switch device.

According to an embodiment of the invention, the current sense unit is connected in series with the switch device.

According to an embodiment of the invention, the power current first flows through the current sense unit and then flows through the switch device.

According to another embodiment of the invention, the power current first flows through the switch device and then flows through the current sense unit.

According to an embodiment of the invention, the current sense circuit comprises a sense resistor. The sense resistor is coupled to the switch device at the sense node and generating the sense voltage at the sense node.

According to an embodiment of the invention, the voltage control circuit comprises a first control resistor and a second control resistor. The first control resistor is coupled between the control node and the gate terminal of the switch device. The second control resistor is coupled between the gate terminal of the switch device and the limit node. The limit node receives the limit signal. The control switch comprises an NPN transistor. The NPN transistor comprises a base terminal, a collect terminal coupled to the limit node, and an emitter terminal coupled to a low voltage level.

According to an embodiment of the invention, the conversion circuit comprises a first conversion resistor and a zener diode. The first conversion resistor is coupled between the sense node and a first conversion node. The zener diode comprises a cathode coupled to the first conversion node and an anode coupled to a second conversion node. The second conversion node is coupled to the base terminal of the NPN transistor. The conversion circuit generates the conversion voltage at the second conversion node.

According to an embodiment of the invention, when the conversion voltage exceeds a threshold voltage of the NPN transistor, the NPN transistor is turned on to pull the limit signal of the limit node down to the low voltage level so that the voltage control circuit stops providing the control signal to the switch device so as to restrict the power current to within a safety range. When the conversion voltage does not exceed the threshold voltage of the NPN transistor, the limit node is floating so that the voltage control circuit provides the control signal to the switch device.

According to another embodiment of the invention, the conversion circuit comprises a second conversion resistor and a third conversion resistor. The second conversion resistor is coupled between the sense node and a conversion node. The third conversion resistor is coupled between the conversion node and the low voltage level. The conversion node is coupled to the base terminal of the NPN transistor. The conversion circuit generates the conversion voltage at the conversion node.

According to an embodiment of the invention, the conversion circuit divides the sense voltage by a ratio of the second conversion resistor and the third conversion resistor to generate the conversion voltage. When the conversion voltage exceeds a threshold voltage of the NPN transistor, the NPN transistor is turned on to pull the limit signal of the limit node down to the low voltage level so that the voltage control circuit stops providing the control signal to the switch device so as to restrict the power current to within a safety range. When the conversion voltage does not exceed the threshold voltage of the NPN transistor, the limit node is floating so that the voltage control circuit provides the control signal to the switch device.

According to an embodiment of the invention, the current sense circuit comprises a sense transistor and a first sense resistor. The sense transistor comprises a gate terminal coupled to a gate terminal of the switch device, a drain terminal coupled to a drain terminal of the switch device, and a source terminal. The first sense resistor is coupled between the source terminal of the sense transistor and a source terminal of the switch device. The conversion circuit converts a voltage at the source terminal of the sense transistor into the conversion voltage.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
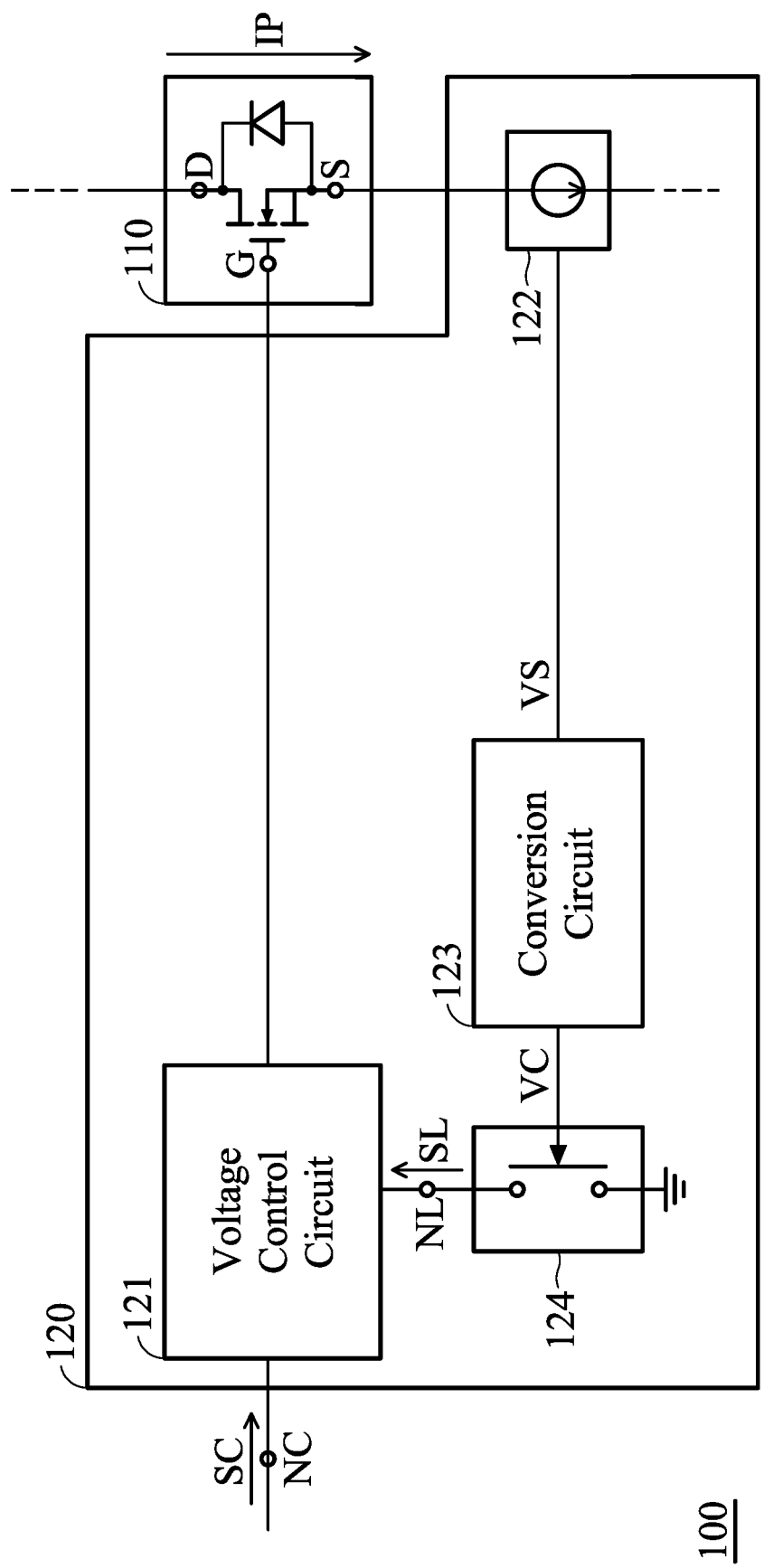
FIG. 1 is a block diagram of a power circuit in accordance with an embodiment of the invention.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It will be understood that, in the description herein and throughout the claims that follow, although the terms "first," "second," etc. may be used to describe various elements, these elements should not be limited by these terms. These terms are only used to distinguish one element from another. For example, a first element could be termed a second element, and; similarly, a second element could be termed a first element, without departing from the scope of the embodiments.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

FIG. 1 is a block diagram of a power circuit in accordance with an embodiment of the invention. As shown in FIG. 1, the power circuit 100 includes a switch device 110 and an over-current protection circuit 120. The switch device 110 is a power switch device, which generates a power current IP flowing through the drain terminal of the switch device 110 to the source terminal S of the switch device 110 according to the control signal SC.

According to an embodiment of the invention, the switch device 110 is a GaN transistor. According to other embodiments of the invention, the switch device 110 may be any transistor that is sustainable for large current flowing through it.

The over-current protection circuit 120 includes a voltage control circuit 121, a current sense unit 122, a conversion circuit 123, and a control switch 124. The voltage control circuit 121 is coupled between the gate terminal G of the switch device 110 and the control node NC, and provides the control signal SC of the control node NC to the gate terminal G of the switch device 110 according to the limit signal SL of the limit node NL so that the switch device 110 is turned on and off according to the control signal SC to generate the power current IP.

According to an embodiment of the invention, the control signal SC may directly drive the switch device 110 without the voltage control circuit 121 and any other pre-driving circuits. According to another embodiment of the invention, there may be some pre-driving circuits between the control signal SC and the voltage control circuit 121 for improving the driving capability of the control signal SC.

The current sense unit 122 senses the power current IP flowing through the switch device 110 to generate a sense voltage VS. As shown in FIG. 1, the current sense unit 122 is connected in series with the switch device 110 so that the power current IP first flows through the switch device 110 and then flows through the current sense unit 122.

The conversion circuit 123 converts the sense voltage VS generated by the current sense unit 122 into a conversion voltage VC. The control switch 124 generates the limit signal SL according to the conversion voltage VC. According to an embodiment of the invention, when the conversion voltage VC exceeds a threshold voltage of the control switch 124, the control switch 124 is turned on to generate the limit signal SL. The voltage control circuit 121 stops providing the control signal SC to the switch device 110 and pulls the gate terminal G of the switch device 110 down so as to restrict the power current IP within a safe range of the switch device 110.

According to another embodiment of the invention, when the conversion voltage VC does not exceed the threshold voltage of the control switch 124, the control switch 124 is off and the limit signal SL is not generated. The voltage control circuit 121 keeps providing the control signal SC to the switch device 110 so that the power current IP flowing through the switch device 110 is not restricted.

In other words, the over-current protection circuit 120 restricts the power current IP flowing through the switch device 110 not exceeding a current limit. When the power current IP exceeds the current limit, the voltage control circuit 121 provides the control signal SC that has been lowered to the gate terminal G of the switch device 110 so as to restrict the power current IP to go further higher. When the power current does not exceed the current limit, the voltage control circuit 121 does not interfere the controlling of the control signal SC turning on and off the switch device 110.

Figure 2:
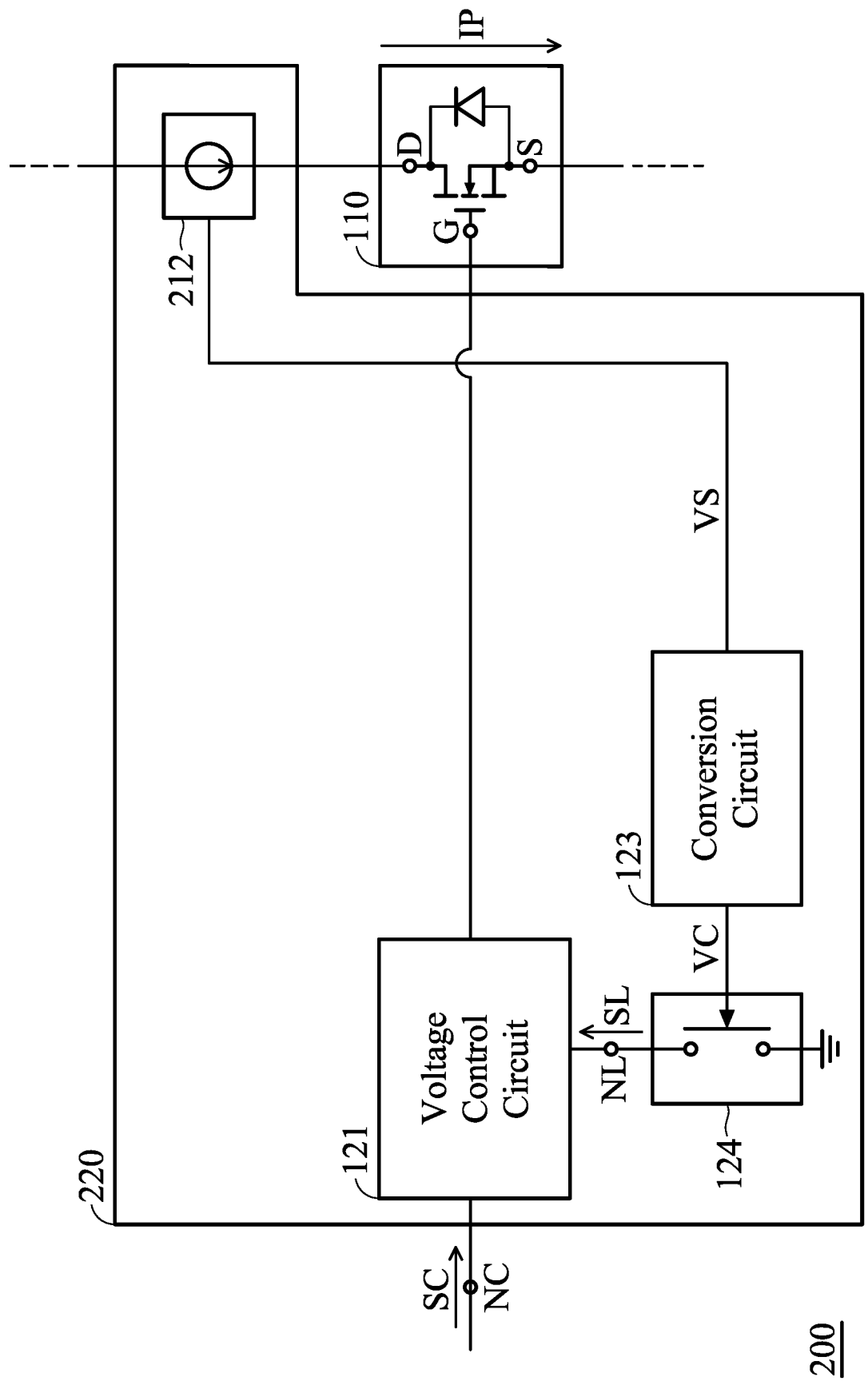
FIG. 2 is a block diagram of a power circuit in accordance with another embodiment of the invention.

FIG. 2 is a block diagram of a power circuit in accordance with another embodiment of the invention. As shown in FIG. 2, the power circuit 200 includes an over-current protection circuit 220. Compared the over-current protection circuit 220 with the over-current protection circuit 120 in FIG. 1, the over-current protection circuit 220 includes a current sense unit 212 which is also connected in series with the switch device 110. However, the power current IP first flows through the current sense unit 212 and then flows through the switch device 110.

Figure 3:
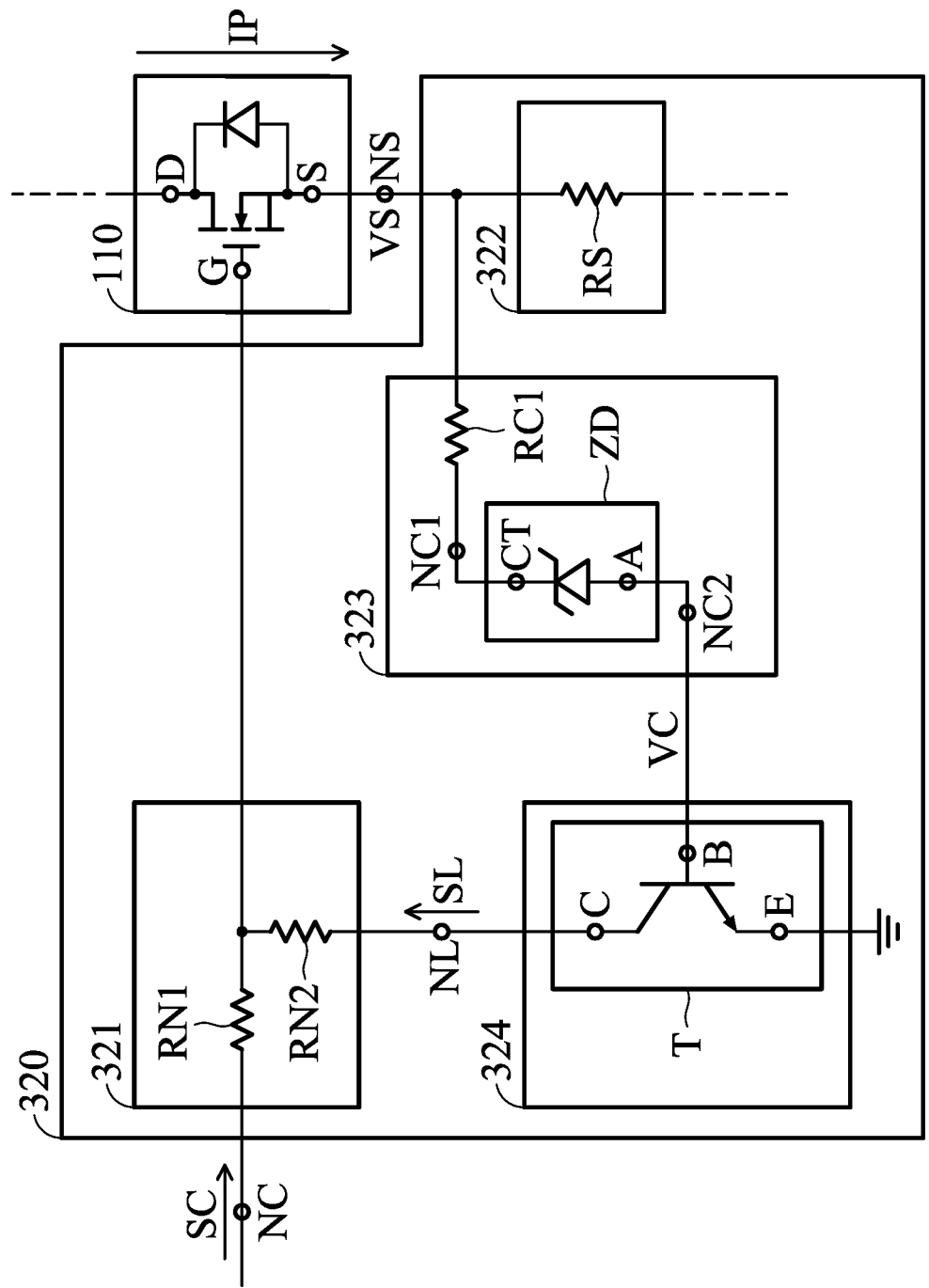
FIG. 3 is a block diagram of a power circuit in accordance with another embodiment of the invention.

FIG. 3 is a block diagram of a power circuit in accordance with another embodiment of the invention. As shown in FIG. 3, the power circuit 300 includes the switch device 110 and the over-current protection circuit 320. The over-current protection circuit 320 includes a voltage control circuit 321, a current sense unit 322, a conversion circuit 323, and a control switch 324, which correspond to the voltage control circuit 121, the current sense unit 122, the conversion circuit 123, and the control switch 124 respectively.

The voltage control circuit 321 includes a first control resistor RN1 and a second control resistor RN2. The first control resistor RN1 is coupled between the control node NC and the gate terminal G of the switch device 110. The second control resistor RN2 is coupled between the gate terminal G of the switch device 110 and the limit node NL. The current sense unit 322 includes a sense resistor RS.

The sense resistor RS is coupled to the source terminal S of the switch device 110 at the sense node NS and generates the sense voltage VS at the sense node NS. According to an embodiment of the invention, when the power current IP flows through the sense resistor RS, the sense resistor RS senses the power current IP to generate the sense voltage VS at the sense node NS.

The conversion circuit 323 includes a first conversion resistor RC1 and a zener diode ZD. The first conversion resistor RC1 is coupled between the sense node NS and a first control node NC1. The zener diode ZD includes a cathode C coupled to the first conversion node NC1 and an anode A coupled to a second conversion node NC2. As shown in FIG. 3, the conversion circuit 323 generates the conversion voltage VC at the second conversion node NC2.

The control switch 324 includes an NPN transistor T. The NPN transistor T includes a base terminal B coupled to the second control node NC2, a collect terminal C coupled to the limit node NL, and an emitter terminal E coupled to a low voltage level, According to other embodiments of the invention, the control switch 324 may include any other types of transistor which can be utilized as a switch. The NPN transistor T is merely illustrated herein, but not intended to be limited thereto. According to some embodiments of the invention, the low voltage level may be any voltage selected by the designer. As illustrated herein, the low voltage level has been illustrated as the ground, but not intended to be limited thereto.

According to an embodiment of the invention, the first control resistor RC1 is configured to limit a current flowing through the zener diode ZD, and the zener diode ZD provides a voltage drop to the sense voltage VS to generate the conversion voltage VC.

According to an embodiment of the invention, when the conversion voltage VC exceeds the threshold voltage of the NPN transistor T, the NPN transistor is turned on to pull the limit signal SL of the limit node NL down to the low voltage level, and the control signal SC is then divided by the ratio of the first control resistor RN1 to the second resistor RN2 to drive the gate terminal G of the switch device 110. When the resistance of the second resistor RN2 is less than that of the first control resistor RN1, the voltage control circuit 300 provides the lowered control signal SC to the gate terminal G of the switch device 110 so as to restrict the power current IP to within the safety range.

According to another embodiment of the invention, when the conversion voltage VC does not exceed the threshold voltage of the NPN transistor T, the NPN transistor T is off and the limit node NL is floating so that the voltage control circuit 321 keeps providing the control signal SC to the gate terminal G of the switch device 110 without interference.

Figure 4:
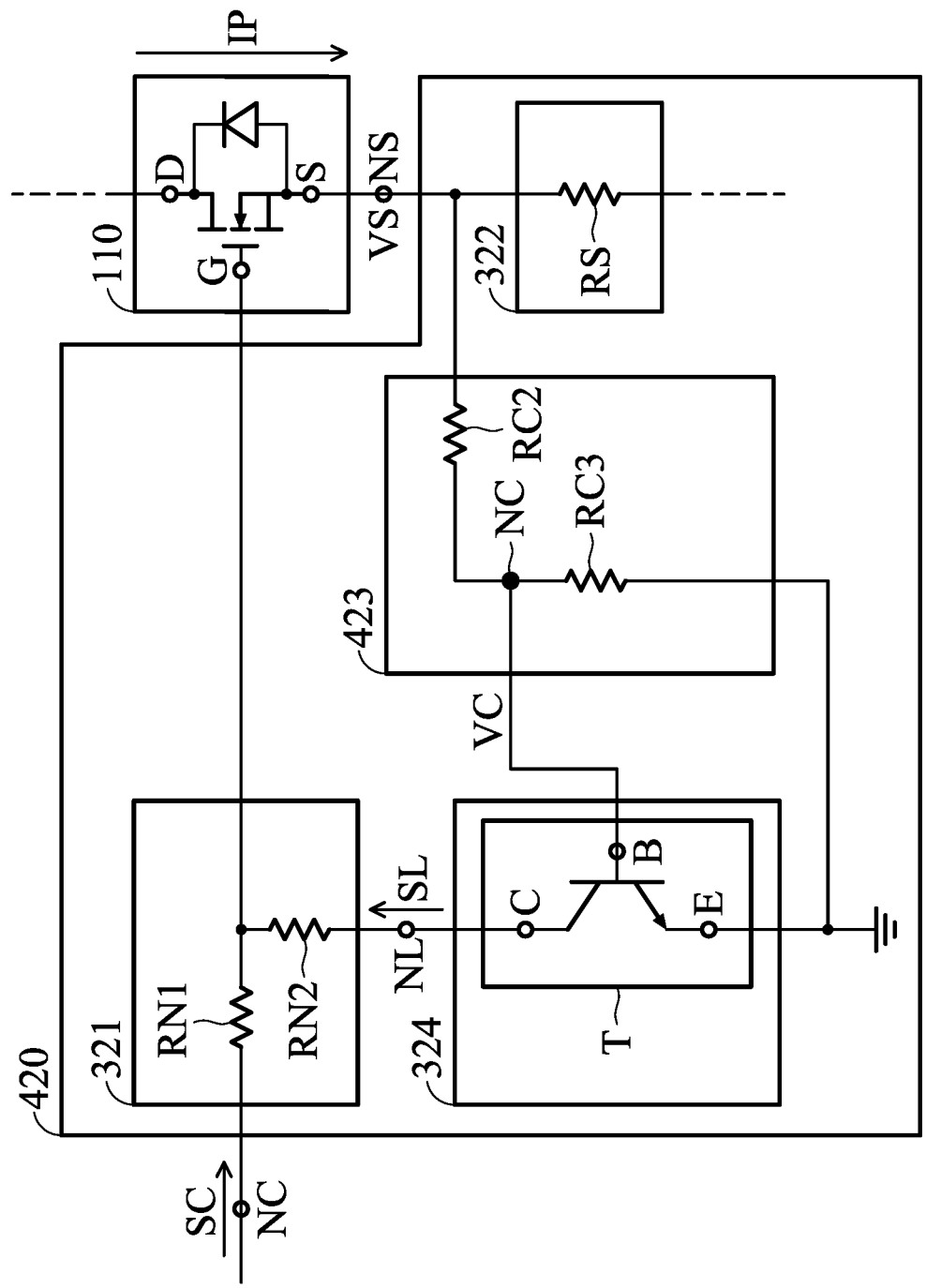
FIG. 4 is a block diagram of a power circuit in accordance with another embodiment of the invention.

FIG. 4 is a block diagram of a power circuit in accordance with another embodiment of the invention. As shown in FIG. 4, the power circuit 400 includes the switch device 110 and the over-current protection circuit 420. Compared the over-current protection circuit 420 with the over-current protection circuit 320 in FIG. 3, the conversion circuit 323 has been replaced with a conversion circuit 423.

As shown in FIG. 4, the conversion circuit 423 includes a second conversion resistor RC2 and a third conversion resistor RC3. The second resistor RC2 is coupled between the sense node NS and the conversion node NC. The third conversion resistor RC3 is coupled between the conversion node NC coupled to the base terminal B of the NPN transistor T and the low voltage level. According to an embodiment of the invention, the conversion circuit 423 generates the conversion voltage VC at the conversion node NC.

When the power current IP flows through the sense resistor RS, the sense resistor RS generates the sense voltage VS at the sense node NS. The conversion circuit 423 then divides the sense voltage VS by a resistor ratio of $$\left(1 + \frac{RC2}{RC3}\right)$$

to generate the conversion voltage VC at the conversion node NC. In other words, the conversion VC is equal to the sense voltage VS multiplied by the resistor ratio of $$\left(\frac{RC3}{RC2 + RC3}\right).$$

According to an embodiment of the invention, when the conversion voltage VC exceeds the threshold voltage of the NPN transistor T, the NPN transistor T is turned on to pull the limit signal SL of the limit node NI, down to the low voltage level so that the control signal SC is then divided by the ratio of the first control resistor RN1 to the second resistor RN2 to drive the gate terminal G of the switch device 110 so as to restrict the power current IP to within the safety range.

According to another embodiment of the invention, when the conversion voltage VC does not exceed the threshold voltage of the NPN transistor T, the NPN transistor T is off and the limit node NL is floating so that the voltage control circuit 321 keeps providing the control signal SC to the gate terminal G of the switch device 110.

Figure 5:
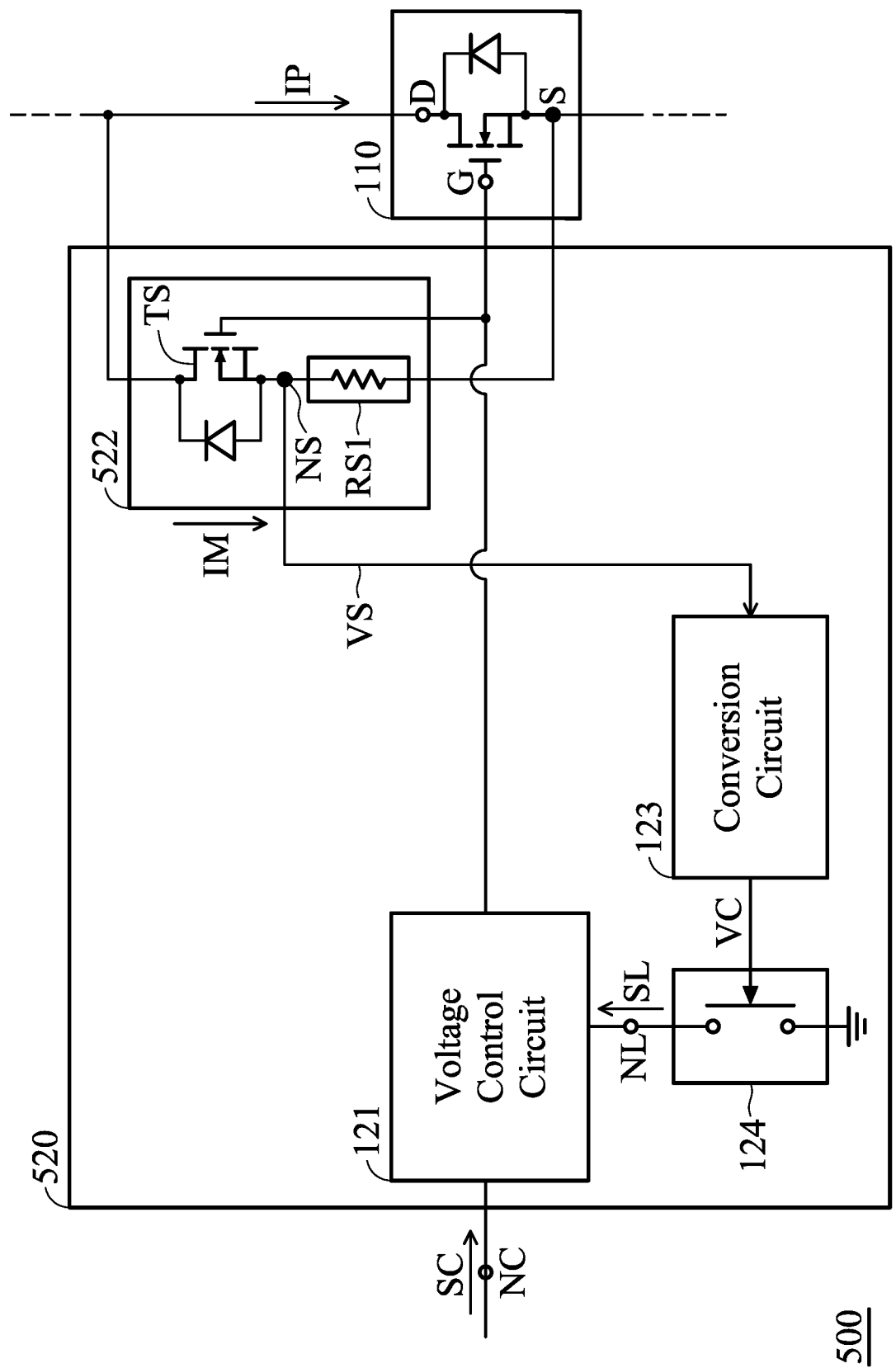
FIG. 5 is a block diagram of a power circuit in accordance with another embodiment of the invention.

FIG. 5 is a block diagram of a power circuit in accordance with another embodiment of the invention. As shown in FIG. 5, the power circuit 500 includes the switch device 110 and an over-current protection circuit 520. Compared the over-current protection circuit 520 with the over-current protection circuit 120 in FIG. 1, the over-current protection circuit 520 includes a current sense circuit 522.

The current sense circuit 522 includes a sense transistor TS and a first sense resistor RS1. The sense transistor TS includes a gate terminal coupled to a gate terminal G of the switch device 110, a drain terminal coupled to the drain terminal D of the switch device 110, and a source terminal coupled to the sense node NS. The sense resistor RS1 is coupled between the source terminal of the sense transistor TS and a source terminal S of the switch device 110. The conversion circuit 123 converts the voltage at the source terminal of the sense transistor TS into the conversion voltage VC.

According to an embodiment of the invention, the sense transistor TS mirrors the power current IP with a ratio to generate a mirrored current IM flowing through the first sense resistor RS1 so as to generate a sense voltage VS at the sense node NS. The conversion circuit 123 then converts the sense voltage VS to generate the conversion voltage VC.

Over-current protection circuits are provided herein so that the power switch devices can be prevented from burning out. In addition, the over-current protection circuits provided herein may be utilized as short-circuit protection.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An over-current protection circuit for limiting a power current flowing through a switch device, wherein the switch device generates the power current according to a control signal of a control node, wherein the over current control circuit comprises:
    a voltage control circuit, providing the control signal to a gate terminal of the switch device according to a limit signal, wherein the voltage control circuit comprises:
        a first control resistor, coupled between the control node and the gate terminal of the switch device; and
        a second control resistor, coupled between the gate terminal of the switch device and a limit node, wherein the limit node receives the limit signal;
    a current sense unit, sensing the power current flowing through the switch device to generate a sense voltage, wherein the current sense circuit comprises:
        a sense resistor, coupled to the switch device at a sense node and generating the sense voltage at the sense node;
    a conversion circuit, converting the sense voltage into a conversion voltage, wherein the conversion circuit comprises:
        a first conversion resistor, coupled between the sense node and a first conversion node; and
        a zener diode, comprising a cathode coupled to the first conversion node and an anode coupled to a second conversion node, wherein the second conversion node is coupled to the base terminal of an NPN transistor, wherein the conversion circuit generates the conversion voltage at the second conversion node; and
    a control switch, generating the limit signal according to the conversion voltage, wherein the control switch comprises:
        the NPN transistor, comprising a base terminal, a collector terminal coupled to the limit node, and an emitter terminal coupled to a low level voltage.

2. The over-current protection circuit as defined in claim 1, wherein when the conversion voltage exceeds a threshold voltage of the control switch, the control switch generates the limit signal so that the voltage control circuit stops providing the control signal to the switch device so as to restrict the power current to within a safety range, wherein when the conversion voltage does not exceed the threshold voltage of the control switch, the control switch does not generate the limit signal so that the voltage control circuit keeps providing the control signal to the switch device.

3. The over-current protection circuit as defined in claim 1, wherein the current sense unit is connected in series with the switch device.

4. The over-current protection circuit as defined in claim 3, wherein the power current first flows through the switch device and then flows through the current sense unit.

5. The over-current protection circuit as defined in claim 1, wherein when the conversion voltage exceeds a threshold voltage of the NPN transistor, the NPN transistor is turned on to pull the limit signal of the limit node down to the low level voltage so that the voltage control circuit stops providing the control signal to the switch device so as to restrict the power current to within a safety range, wherein when the conversion voltage does not exceed the threshold voltage of the NPN transistor, the limit node is floating so that the voltage control circuit provides the control signal to the switch device.

6. An over-current protection circuit for limiting a power current flowing through a switch device, wherein the switch device generates the power current according to a control signal of a control node, wherein the over current control circuit comprises:
    a voltage control circuit, providing the control signal to a gate terminal of the switch device according to a limit signal, wherein the voltage control circuit comprises:
        a first control resistor, coupled between the control node and the gate terminal of the switch device; and
        a second control resistor, coupled between the gate terminal of the switch device and a limit node, wherein the limit node receives the limit signal;
    a current sense unit, sensing the power current flowing through the switch device to generate a sense voltage, wherein the current sense circuit comprises:
        a sense resistor, coupled to the switch device at a sense node and generating the sense voltage at the sense node;
    a conversion circuit, converting the sense voltage into a conversion voltage, wherein the conversion circuit comprises:
        a second conversion resistor, coupled between the sense node and a conversion node; and
        a third conversion resistor, coupled between the conversion node and a low level voltage; and
    a control switch, generating the limit signal according to the conversion voltage, wherein the control switch comprises:
        an NPN transistor, comprising a base terminal, a collector terminal coupled to the limit node, and an emitter terminal coupled to the low level voltage, wherein the conversion node is coupled to the base terminal of the NPN transistor, wherein the conversion circuit generates the conversion voltage at the conversion node.

7. The over-current protection circuit as defined in claim 6, wherein the conversion circuit divides the sense voltage by a ratio of the second conversion resistor and the third conversion resistor to generate the conversion voltage, wherein when the conversion voltage exceeds a threshold voltage of the NPN transistor, the NPN transistor is turned on to pull the limit signal of the limit node down to the low level voltage so that the voltage control circuit stops providing the control signal to the switch device so as to restrict the power current to within a safety range, wherein when the conversion voltage does not exceed the threshold voltage of the NPN transistor, the limit node is floating so that the voltage control circuit provides the control signal to the switch device.

8. A power circuit, comprising:
    a switch device, generating a power current according to a control signal of a control node; and
    an over-current protection circuit, limiting the power current flowing through the switch device, wherein the over current control circuit comprises:
        a voltage control circuit, providing the control signal to a gate terminal of the switch device according to a limit signal, wherein the voltage control circuit comprises:
            a first control resistor, coupled between the control node and the gate terminal of the switch device; and
            a second control resistor, coupled between the gate terminal of the switch device and a limit node, wherein the limit node receives the limit signal;
        a current sense unit, sensing the power current flowing through the switch device to generate a sense voltage, wherein the current sense circuit comprises:

a sense resistor, coupled to the switch device at a sense node and generating the sense voltage at the sense node;

a conversion circuit, converting the sense voltage into a conversion voltage, wherein the conversion circuit comprises:

a first conversion resistor, coupled between the sense node and a first conversion node; and a zener diode, comprising a cathode coupled to the first conversion node and an anode coupled to a second conversion node, wherein the second conversion node is coupled to the base terminal of an NPN transistor, wherein the conversion circuit generates the conversion voltage at the second conversion node; and a control switch, generating the limit signal according to the conversion voltage, wherein the control switch comprises:

the NPN transistor, comprising a base terminal, a collector terminal coupled to the limit node, and an emitter terminal coupled to a low level voltage.

9. The power circuit as defined in claim 8, wherein when the conversion voltage exceeds a threshold voltage of the control switch, the control switch generates the limit signal so that the voltage control circuit stops providing the control signal to the switch device so as to restrict the power current to within a safety range, wherein when the conversion voltage does not exceed the threshold voltage of the control switch, the control switch does not generate the limit signal so that the voltage control circuit keeps providing the control signal to the switch device.

10. The power circuit as defined in claim 8, wherein the current sense unit is connected in series with the switch device.

11. The power circuit as defined in claim 10, wherein the power current first flows through the switch device and then flows through the current sense unit.

12. The power circuit as defined in claim 8, wherein when the conversion voltage exceeds a threshold voltage of the NPN transistor, the NPN transistor is turned on to pull the limit signal of the limit node down to the low level voltage so that the voltage control circuit stops providing the control signal to the switch device so as to restrict the power current to within a safety range, wherein when the conversion voltage does not exceed the threshold voltage of the NPN transistor, the limit node is floating so that the voltage control circuit provides the control signal to the switch device.

\* \* \* \* \*